United States Patent [19]
Corleto et al.

[11] Patent Number: 5,668,749
[45] Date of Patent: Sep. 16, 1997

[54] CIRCUIT FOR PERFORMING ARITHMETIC OPERATIONS IN A DEMODULATOR

[75] Inventors: Jose G. Corleto; Gregg S. Kodra, both of Austin, Tex.

[73] Assignee: Motorola, Inc., Schaumburg, Ill.

[21] Appl. No.: 435,105

[22] Filed: May 4, 1995

[51] Int. Cl.$^6$ .................................................. G06F 7/38
[52] U.S. Cl. ...................................................... 364/736.01
[58] Field of Search .............................. 364/736, 724.01

[56] References Cited

U.S. PATENT DOCUMENTS

| | | | |
|---|---|---|---|
| 4,467,444 | 8/1984 | Harmon, Jr et al. | 364/736 |
| 4,949,292 | 8/1990 | Hoshino et al. | 364/736 |
| 5,388,058 | 2/1995 | Yamada | 364/736 |

*Primary Examiner*—Tan V. Mai

[57] ABSTRACT

A circuit (10) for determining a radius value and a phase value from an in-phase signal I(n) and a quadrature signal Q(n) iteratively approximates the phase value and the radius value based upon initial in-phase signal and quadrature signal preferably using the coordinate rotational digital computer (CORDIC) algorithm. The circuit (10) includes a multi-task arithmetic unit (50), memory (20), and a controller (30). The multi-task arithmetic unit includes registers (12, 14, 16), multiplexers (18, 22), shift registers (24, 25), and an adder (26) to perform various arithmetic operations. The circuit (10) further includes dynamic memory (32) for storing the solutions at different points in time of the radius value and phase value, which are subsequently used in the filtering of radius values and phase values.

13 Claims, 2 Drawing Sheets

CIRCUIT FOR PERFORMING ARITHMETIC OPERATIONS IN A DEMODULATOR

TECHNICAL FIELD OF THE INVENTION

This invention relates generally to digital radio receivers, and more particularly to a digital circuit for demodulating broadcast frequency modulated (FM) and amplitude modulated (AM) signals and for digitally filtering the signals.

BACKGROUND OF THE INVENTION

The reception and demodulation of broadcast AM and FM signals are known in the art. Historically, the reception and demodulation of AM and FM signals was performed using analog circuitry in which a number of analog components received incoming signals, removed the amplitude and phase portions of the signals, and passed the information contained in the amplitude and phase portions of the signals along for further processing and output. More recently, the advent of digital circuitry has allowed designers to create radios which employ digital signal processing in the demodulation and filtering of the signals.

A digital AM/FM radio receives a broadcast signal in an analog format using an antenna. A radio frequency (RF) interface then amplifies the analog signal and passes the amplified signal to a tuner. The tuner locks onto a desired frequency component of the signal and remodulates the desired frequency component to 10.7 MHz. An IF processor then receives the remodulated analog signal, converts the analog signal to a digital representation of the signal, and then quadrature mixes down the digital signal to produce an in-phase signal and a quadrature signal. The in-phase and quadrature signals are then digitally filtered to improve the selectivity of the receiver and reduce the adjacent channel interference. A demodulation unit demodulates the in-phase signal and quadrature signal to produce a magnitude, or radius, value and a phase value. FM information and AM information are then extracted from the demodulated signals. The FM and AM information is then decimated to a lower sampling frequency, the decimation step consisting of low pass filtering and undersampling to the new sampling rate. Once the phase and magnitude signals are sampled at a lower rate, they can be further processed digitally to remove induced ignition noise and to retrieve the audio signal that was encoded at the broadcast station.

The conversion of in-phase and quadrature signals to magnitude and phase values, and the subsequent filtering of such values has remained a difficult and computationally intensive task. Most algorithms that address this conversion process require expensive hardware implementations, typically requiting fast, large, and power consuming adders and multipliers that limit the efficiency of the digital demodulation approach, thus outweighing its advantages over traditional analog means.

Several algorithms have reduced the complexity of the demodulation process, thereby increasing efficiency and reducing hardware requirements. One particular algorithm is the angle accumulation mode of the coordinate rotational digital computer (CORDIC) algorithm, an iterative procedure that approximates amplitude and phase values based upon in-phase and quadrature vectors. While the CORDIC algorithm still requires multiplications, additions, and subtractions, the multiplications are such that they can be implemented by shift registers, thus reducing the hardware requirements.

Even though the CORDIC algorithm does not require hardware multipliers, at least two shifters and three adders are needed to perform the conversion process in addition to storage elements. Thus, devices performing the CORDIC algorithm still required substantial hardware that, by itself, could not perform the digital filtering operations that were required in the subsequent decimation processes. The complexity of the prior art devices for implementing the amplitude and phase calculations and the subsequent digital filtering for the decimation, resulted in substantial cost and reduced performance, thereby limiting the overall performance of a digital demodulation approach.

Thus, there exists a need in the art for an apparatus that efficiently, and with minimal circuit components, converts in-phase signals and quadrature signals to radius values and phase values and performs subsequent filtering operations.

DETAILED DESCRIPTION OF THE DRAWINGS

Generally, the present invention provides a circuit for performing various arithmetic operations and more particularly a circuit for determining a radius value and a phase value from an in-phase signal and quadrature signal for use in a radio's demodulator. Radius values and phase values are determined by the circuitry which iteratively approximates the phase value and the radius value based upon initial in-phase signal and quadrature signal and by the error at each iterative step. The circuitry preferably also filters signals. The circuitry uses a scheme of registers, multiplexers, shift registers, adders, and memory, all controlled by a controller, to perform the iterative calculations required. The circuitry further includes dynamic memory for storing the resultants at each sampling interval which are used in the filtering of the radius values and phase values. Iterative solutions as well as other arithmetic operations are performed by the circuitry of the present invention in reduced number of operations, providing benefits previously unavailable.

Figure 1:
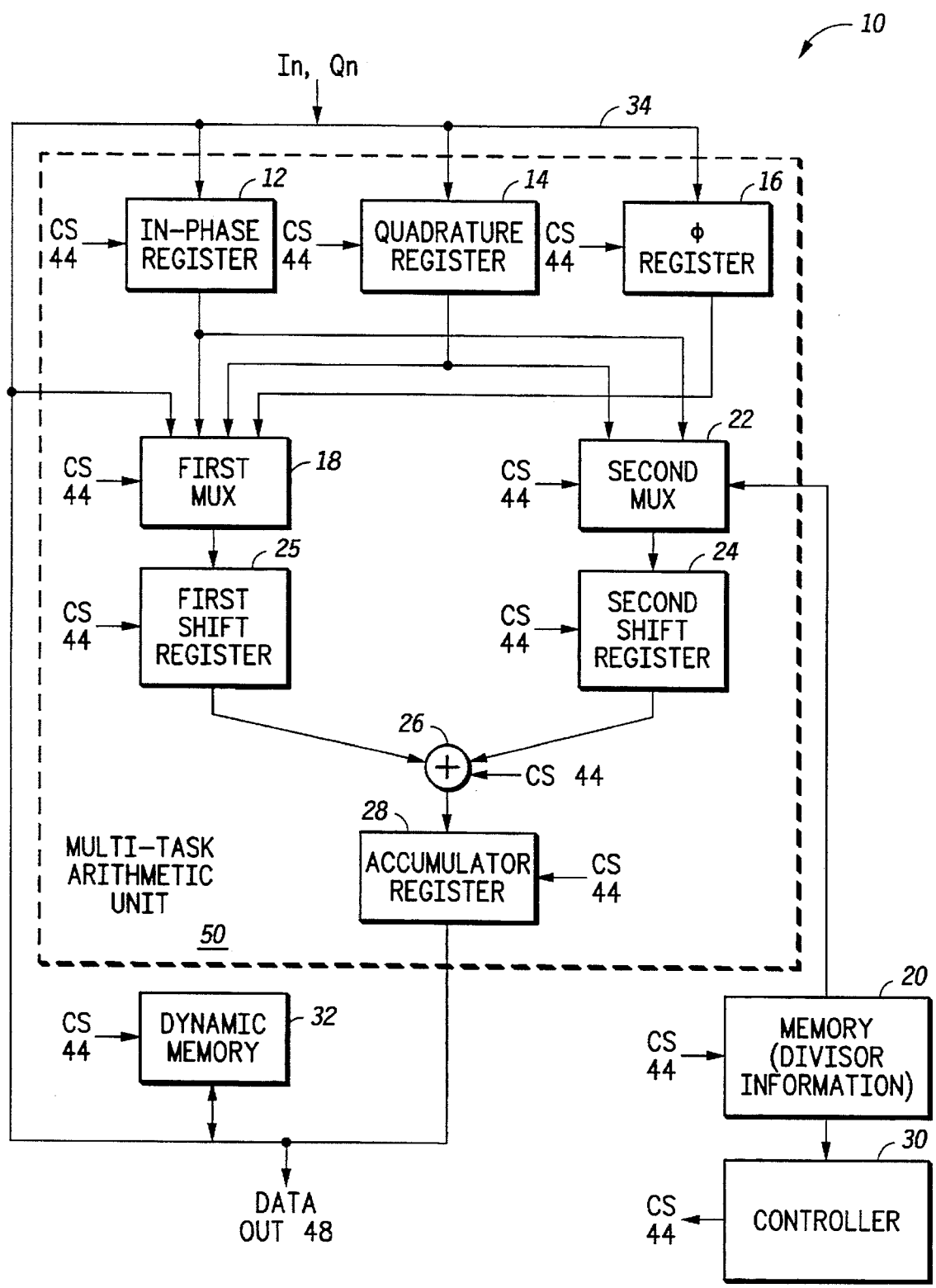
FIG. 1 illustrates a schematic block diagram of a circuit for determining a radius value and phase value in accordance with the present invention.

FIG. 1 illustrates a circuit 10 for determining radius values and phase values from in-phase and quadrature signals and for performing various filtering operations. The circuit also performs filtering operations and other arithmetic operations as required. The circuit 10 comprises memory 20, a controller 30, and a multi-task arithmetic unit 50. While the functions performed by the circuitry 10 of the present invention are readily applicable to digital radios, the overall operation of a digital radio is not readily germane to the present invention. Thus, the overall operation of a digital radio will only be described to further illustrate the operation of the present invention.

Memory 20 preferably comprises read only memory (ROM) or other static memory which stores constants to be used in the operations performed by the circuitry 10. Because the circuit 10 of the present invention may perform redundant calculations using the CORDIC algorithm, and because the CORDIC algorithm requires redundant use of constants, the memory 20 facilitates an efficient execution of the CORDIC algorithm by providing direct access to the constants used in the algorithm. As is known in the art, the selection of memory 20 depends upon system requirements, such requirements not further described herein.

The multi-task arithmetic unit 50 comprises an in-phase register 12, a quadrature register 14, an angular register 16, a first multiplexer 18, a second multiplexer 22, a second shift register 24, adder 26, accumulator register 28, and controller 30 operably coupled to one another. The multi-task arithmetic unit 50 also includes a first shift register 25. Data bus 34 operably couples the components of the arithmetic unit 50 and also allows for the output of data at data out port 48. The multi-task arithmetic unit 50 performs various arithmetic functions, one of which is to determine a radius value and a phase angle from an in-phase signal and a quadrature signal.

The first multiplexer 18 operably couples to the data bus 34, the in-phase register 12, the quadrature register 14, and the angular register 16. The second multiplexer 22 operably couples to the in-phase register 12, the quadrature register 14, and the memory 20. The second shift register 24 receives as its input the output of the second multiplexer 22 while the first shift register 25 receives as its input an output of the first multiplexer 18. Adder 26 receives as its two inputs the output of the first shift register 25 and the output of the second shift register 24. The adder 26 may add the contents of the second shift register 24 to the first shift register 25 or may subtract the contents of the second shift register 24 from the first shift register 25, depending upon a control signal 44, to produce its output. Assuming that an input value from the first shift register 25 is input A, and the input from the second register 24 is input B, the operation of adder 26 is either (A+B) or (A−B), depending upon the control signal 44 received at the adder 26. The accumulator register 28 receives as its input the output of the adder 26 and selectively provides its output to the system bus 34.

The circuit 10 may also include dynamic memory 32 which interoperably couples to the first multiplexer 18, the data bus 34, the in-phase register 12, the quadrature register 14, the angular register 16, and the accumulator register 28 and stores radius values and phase values as well as other resultants produced by the multi-task arithmetic unit 50. Preferably, the dynamic memory 32 comprises random access memory (RAM) or other dynamic memory known in the art. The dynamic memory 32 also receives and provides data to the data bus 34.

The controller 30 provides control signals 44 to the in-phase register 12, quadrature register 24 and the angular register 16, the first multiplexer 18, the memory 20, the second multiplexer 22, the accumulator register 28, the first shift register 25, the second shift register 24, and the dynamic memory 32. The controller 30 accepts values (filter coefficients) from the memory 20 and issues control signals 44 based at least partially upon these values. Based upon the control signals 44, the radius value and the phase value are determined by iteratively approximating the radius value and the phase value based upon the values of the in-phase signal and quadrature signal. Such calculations are performed in accordance with the CORDIC algorithm.

In operation, the in-phase register 12 and quadrature register 14 receive in-phase and quadrature signals over data bus 34. The notations I(n) and Q(n) represent the in-phase and quadrature signals for sample interval (n), respectively. The in-phase signal and quadrature signal have been previously digitized and filtered and represent a quantized sample of an analog signal taken at a time (n). The controller 30 provides the control signals 44 necessary to load the in-phase and quadrature signals into the in-phase register 12 and quadrature signal 14, respectively. Once loaded, the algorithm may commence. Preferably, the circuit 10 of the present invention uses the angle accumulation mode of the CORDIC algorithm to calculate the radius value and phase value from the in-phase signal and the quadrature signal. The algorithm preferably requires 15 iterations and proceeds as follows for iterations k=1 to 15:

For iteration k=1:
$\emptyset(n,1)=Sq*\pi/2$
$I(n,1)=Sq* Q(n)$
$Q(n,1)=-Sq* I(n)$
where Sq=the sign of Q(n,k−1). Therefore, for k=1, Sq=the sign of Q(n).

For iterations k=2, . . . 15:
$\emptyset(n,k)=\emptyset(n,k-1)+Sq*atan[2^{1-k}]$
$I(n,k)=I(n,k-1)+Sq*Q(n,k-1)*2^{1-k}$
$Q(n,k)=Q(n,k-1)-Sq*I(n,k-1)*2^{1-k}$
where $atan[2^{1-k}]$=arctangent of $2^{1-k}$ With reference to the circuit 10 of the present invention, for iteration k=1, the in-phase register 12 first receives I(n) and the quadrature register 14 receives Q(n). Then, π/2 is loaded into the second multiplexor 22 from memory 20 based upon control signal 44 and provided as a second input to the adder 26. The value in the first multiplexor 18 is nulled and provided as the first input to the adder 26. Based upon the sign of Q(n), the controller 30 provides a control signal 44 to the adder such that either an addition or substraction is performed. The accumulator register 28 receives Ø(n,1) from the adder 26 and the value is transmitted over the bus 34 to the angular register 16 for use in the next iteration.

For the calculation of I(n,1), Q(n) is loaded from the quadrature register 14, passed through the second multiplexer 22, passed through the second shift register 24 unshifted, and provided as the second input to the adder 26. The first multiplexer 18 provides a null value through the first shift register 25 to the adder 26 as the adder's first input. Based upon the sign of Q(n), the controller 30 provides a control signal 44 to the adder 26 such that the adder performs either an addition or subtraction operation. The accumulator register 28 receives I(n,1) and then transmits the value to the in-phase register 12 via bus 34.

For the calculation of Q(n,1), I(n) is passed from the in-phase register 12, through the second multiplexer 22, passed through the second shift register 24 without a shift, and provided as the second input to the adder 26. A null value is provided to the adder 26 by the first multiplexor 18, passed through the first shift register 25 unshifted, and received as the first input of the adder 26. Based upon the sign of Q(n), the controller 30 provides a control signal 44 to the adder 26 causing the adder 26 to either perform an addition or subtraction operation. The accumulator register 28 receives the result from the adder 26, Q(n,1), and provides the result to the quadrature register via bus 34.

For iteration k=2, the phase value, Ø(n,2) is produced by summing $\emptyset(n,1)+Sq*atan[2^{-1}]$. Based upon the control signal 44 and the iteration index, the second multiplexor receives the correct information from memory 20. The value provided by the memory 20 equals the value of $atan[2^{-1}]$. The contents of the angular register 16, Ø(n,1), are provided to the first multiplexer 18. The first multiplexer 18 then feeds the value through the first shift register 25 without a shift to the adder 26 as the adders first input. The second multiplexer 22 feeds its contents through the second shift register 24 without a shift and provides the value as the adder's 26 second input. Based upon the sign of Q(n,1), the controller 30 provides control signal 44 to the adder 26 such that the adder 26 performs either an addition or subtraction operation in accordance with the algorithm. The resultant from the adder 26, Ø(n,2), is then received by the accumulator register 28. Based upon the control signal 44, the value Ø(n,2) is then provided to the angular register 16 via bus 34 and stored for the next operation.

For iteration k=2, I(n,2)=I(n,1)+Sq*Q(n,1)*2⁻¹. To accomplish this operation, the contents of the in-phase register 12, I(n,1), are loaded into the first multiplexer 18 and fed directly through the first shift register 25 without a shift to the adder 26 as its first input. The contents of the quadrature register 14 are then provided to the second multiplexer 22. From the second multiplexer 22, the value of Q(n,1) is provided to the second shift register 24 and shifted 1bit to the right in accordance with the algorithm. The value from the second shift register 24 then inputs to the adder 26 as the second adder input. Based upon the sign of Q(n,1), controller 30 provides control signal 44 to the adder 46 to execute either an addition or a subtraction operation in accordance with the algorithm. The resultant from the adder 26, I(n,2), is then received by the accumulator register 28. Based upon the control signal 44, the value I(n,2) is then provided to the inphase register 12 via bus 34 and stored for the next operation.

Finally, for iteration k=2, Q(n,2)=Q(n,1) −Sq*I(n,1)*2⁻¹. To perform this operation, the contents of the quadrature register 14, Q(n,1), are input to the first multiplexer 18, fed through the first shift register 25 and provided to the adder 26 as a first adder input. The contents of the in-phase register 12 are provided to the second multiplexer 22, fed to the first shift register 25, shifted 1bit to the right, and provided to the adder 26 as a second adder input. Based upon the sign of Q(n,1), control signal 44 is provided by the controller 30 causing the adder 26 to either add its inputs or subtract its second input from its first input. The result from the adder 26, Q(n,2), is provided to the accumulator register 28 and then transmitted over the data bus 34 to the quadrature register 14.

For iterations k=3–15, the circuit 10 performs the CORDIC algorithm consistent with the steps performed for iteration k=2. Based upon iterations 3–15, the final results produced by the algorithm, I(n,15) and Ø(n,15), represent the radius value, or magnitude, and the phase value, respectively, by using only one adder which was not realizable with prior art circuits. After each operation of the circuit 10 to determine a radius value and a phase value, the values are preferably stored in dynamic memory 32 for future use in filtering operations and also provided as data out 48 over bus 34.

The circuit 10 of the present invention further comprises interoperable coupling of the dynamic memory 32, the in-phase register 12, and the accumulator register 28 to extract amplitude modulated (AM) information from radius values based on amplitude modulation control signals 44 provided by the controller. Because, the radius value I(n,15) represents AM information for sample period (n), the controller extracts the AM information simply by accessing the AM information from its resident location and providing the value of signal I(n,15) as data out 48. However, as one skilled in the art will readily appreciate, further manipulations of the radius value I(n,15) may be required to enhance the signal.

Circuit 10 extracts the FM information from the calculated phase values by operating arithmetically on the phase values. Thus, the circuit 10 further comprises interoperable coupling of the dynamic memory 32, the in-phase register 12, the quadrature register 14, the first multiplexer 18, the second multiplexer 22, the adder 26, and the accumulator register 28 to extract frequency modulated (FM) information from phase values based upon frequency modulation control signals 44 provided by the controller. FM information, represented by MPX(n), is extracted from phase values as follows:

MPX(n)=Ø(n,15)−Ø(n−1,15)

In an operation to extract FM information, circuit 10 first loads the resultant of the current phase value Ø(n,15) in the first multiplexer 18 and passes the value through the first shift register 25 without shift to the adder 26. Next, the circuit 10 retrieves the value Ø(n−1,15) from memory 32, passes the value to the quadrature register 14 over the data bus 34, feeds the value to the second multiplexer 22, and passes the value through the second shift register 24 to the adder 26 without a shift, and passes the resultant to the accumulator register 28. The circuit 10 then provides the value MPX(n) as data out 48 for further use, stores the value in dynamic memory 32, or both.

The circuit 10 initially extracts unfiltered AM and FM information at high sampling rates. However, it may be desirable to decimate the signals to lower sampling rates so that further processing, such as audio signal processing, may be performed on the AM/FM information at lower processing speeds. As is known in the art, the decimation process also requires that the signal be low pass filtered to avoid aliasing of high frequency components into the band of interest. For this reason, circuit 10 further comprises interoperable coupling of the dynamic memory 32, the in-phase register 12, the quadrature register 14, the first multiplexer 18, the second multiplexer 22, the first shift register 25, the second shift register 24, the adder 26, and the accumulator register 28 to produce filtered signals from radius values and phase values based upon filter control signals provided by the controller 30. The interoperable coupling also may operate to filter AM and FM information that has previously been derived from the radius values and phase values. The filtering may be performed in a number of ways and one skilled in the art will readily appreciate that the circuit 10 of the present invention allows a variety of filtering functions to be performed. However, herein, only comb filters as well as their equivalent cascaded uniform finite impulse response (FIR) implementations are discussed.

Comb filters perform a plurality of additive operations to remove high frequency components from unfiltered signals prior to decimation. Therefore, the FM information, MPX (n), previously derived, may be filtered in accordance with a cascade of N stages of uniform FIR filters of order M. The individual transfer function of each stage is given by:

$$H_I(z) = 1/(M+1) \sum_{k=0}^{M} z^{-k}$$

The advantage of this type of filter is that it does not require multiplications and that all coefficients are unity, thus requiring no coefficient storage. Thus, for example, for M=1 and N=4, a cascaded filter having four stages, each stage being of a first order, will have a transfer function of:

$H_{TC}=[(1+z^{-1})/2]^4$

The function may be implemented as a cascade of filters, each having a transfer function (½)*(1+z⁻¹). Given MPX(n) from the CORDIC algorithm, MPXD(n) the filtered value of the FM signal, could be computed as follows:

MPX1(n)=[MPX(n)+MPX(n−1)]*½

MPX2(n)=[MPX1(n)+MPX1(n−1)]*½

$$MPX3(n)=[MPX2(n)+MPX2(n-1)]*\tfrac{1}{2}$$

$$MPXD(n)=[MPX3(n)+MPX3(n-1)]*\tfrac{1}{2}$$

The final result, MPXD(n), equals the filtered FM signal for sample interval (n). In order to perform these filtering operations, an iterative addition function is performed using the quadrature register 14, the angular register 16, the first multiplexer 18, the second multiplexer 22, the adder 26, the accumulator register 28, and the dynamic memory 32. Preferably, the in-phase register 12 is not used in the filtering operation because it retains the previously determined radius value. However, one skilled in the art will readily appreciate that the radius value could be stored in dynamic memory 32 instead. Controller 30 provides control signals 44, which access dynamic memory 32 to access the required information, and provides the information to the angular register 16 and the quadrature register 14. These values are then routed through the first multiplexer 18 and the second multiplexer 22, through the first shift register 25 and second shift register 24, both shifted by one bit to the right to accomplish the multiplication by ½, and then provided to the adder 26. The adder 26 performs the required operation and places the resultant in the accumulator register 28. Intermediate results are stored in dynamic memory 32 and accessed as required for the addition operations. Finally, a filtered result MPXD(n) is provided for sample interval (n) and provided as data out 48. As one skilled in the art will readily appreciate, the addition operations for various orders of comb filters can easily be performed by the circuit 10 of the present invention.

A second type of filter that may be implemented using the circuit 10 of the present invention is the non-unity coefficient finite impulse response (FIR) filter that includes a series of multiplication and addition operations to produce filtered signals. Given an input signal x(n), a jth order non-unity coefficient FIR filter may be described to produce a filtered output Fx(n) in accordance with the following equation:

$$Fx(n) = \sum_{i=0}^{j} k(i) * x(n-i)$$

Were k(i) are non-unity filter coefficients that reside in memory 20 and x(n–i) are previous input values residing in dynamic memory 32. Thus, the FIR filtering function operates on values x(n) obtained during previous sampling periods, multiplying them by constants k(i) and then adding these products to produce Fx(n). The coefficients k(i) stored in memory 20 are made available to the controller 30 for decoding in accordance with modified Booth's algorithm. The x(n–1) values stored in dynamic memory 32 are sequentially loaded into the quadrature register 14. Each product k(i)*x(n–1) can be generated in eight cycles. During each of these cycles the controller 30 examines adjacent bits of the k(i) value in accordance with modified Booths algorithm and determines control signals 44 for shifter 24, shifter 25, both multiplexors 18 and 22, the quadrature register 14, the angular register 16, and the accumulator 28. For each cycle, bits of k(i) that are decoded determine the actions of the components of the circuit 10. During each cycle prior to the final cycle, an intermediate result is generated by the adder 26. Based upon the value of three bits of the FIR filter, the circuit 10 operates to produce filtered results. Based upon the k(i) bits, values are loaded into the first multiplexor 18 (1st mux), loaded into the second multiplexor 22 (2nd mux), shifted by the operation of the first shift register 25 (1st SR), shifted by the operation of the second shift register 24 (2nd SR), and operated upon by the adder 26 in accordance with the following:

| k(i) bits | 1st mux load | 2nd mux load | 1st SR shift | 2nd SR shift | Adder |
|-----------|--------------|--------------|--------------|--------------|----------|
| 000 | ACC | Null | Right 2 | None | add |
| 001 | ACC | Q Reg | Right 2 | None | add |
| 010 | ACC | Q Reg | Right 2 | None | add |
| 011 | ACC | Q Reg | Right 2 | Left 1 | add |
| 100 | ACC | Q Reg | Right 2 | Left 1 | subtract |
| 101 | ACC | Q Reg | Right 2 | None | subtract |
| 110 | ACC | Q Reg | Right 2 | None | subtract |
| 111 | ACC | Null | Right 2 | None | add |

After completing the eight cycles of computations for each k(i) * x(n–1) product, Fx(n) is produced in the accumulator register 28. The value is then provided as data out 48 for further use. Through the iterative process and use of the modified Booth algorithm, the circuit 10 of the present invention efficiently performs the FIR filter. Thus, the present invention uses only a single adder to perform the CORDIC algorithm and subsequent filtering. By needing only one adder, the present invention consumes less power, requires less circuitry, and uses less die area than prior art circuits.

Figure 2:
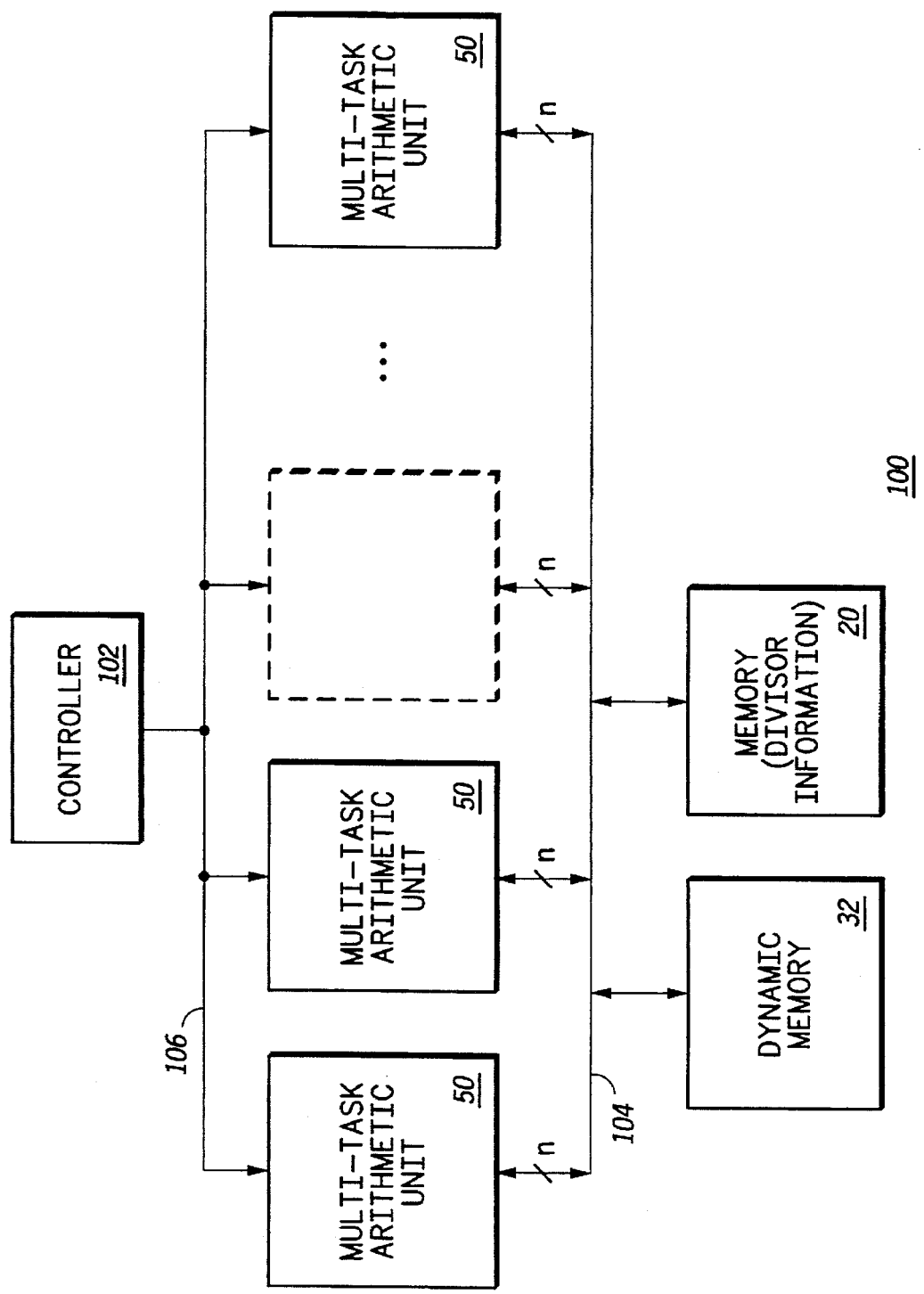
FIG. 2 illustrates a schematic block diagram of a parallel processor for performing various arithmetic operations in accordance with the present invention.

FIG. 2 illustrates a schematic block diagram of a parallel processor 100 for accomplishing arithmetic operations. Preferably, the parallel processor 100 comprises a plurality of multi-task arithmetic units 50, data bus 104 operably coupled to each multi-task arithmetic unit 50, memory 20 operably coupled to each multi-task arithmetic unit 50, dynamic memory 32 operably coupled to each multi-task arithmetic unit 50, and controller 102 that provides control signals to each of the multi-task arithmetic units 50, wherein, based on the control signals, various arithmetic operations are performed by the parallel processor.

With reference to FIG. 1, each multi-task arithmetic unit 50 preferably comprises an in-phase register 12, a quadrature register 14, an angular register 16, a first multiplexer 18, a second multiplexer 22, a first shift register 25, a second shift register 24, an adder 26, and an accumulator register 28 operably coupled to one another. Each multi-task arithmetic unit 50 may operate to perform any of a variety of arithmetic operations. For example each multi-task arithmetic unit 50 may calculate radius and phase values based upon in-phase and quadrature signals, may extract AM and FM information from other signals, may filter signals, may perform multiplication operations, or may perform various other operations.

In many applications, processing requirements dictate that arithmetic operations are performed in parallel to produce desired results. Thus, the parallel processor 100 of the present invention may allow memory resources to be shared while allocating processing requirements among the multi-task arithmetic units 50. With specific reference to a digital radio application, one multi-task arithmetic unit 50 coupled with memory 20 and dynamic memory 32 may perform the CORDIC angle accumulation mode algorithm while another multi-task arithmetic unit 50 may perform a filtering function. Because data comes into the digital radio sequentially over time, it is expected that each multi-task arithmetic unit 50 may function on portions of the data without corrupting other portions of the data. In this fashion, superior data conversion, extraction, and filtering functions are available with the parallel processor 100.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. A circuit for determining a radius value and a phase value from an in-phase signal and a quadrature signal, the circuit comprising:

an in-phase register;

a quadrature register;

an angular register;

a first multiplexer operably coupled to the in-phase register, the quadrature register, and the angular register;

memory for storing phase divider information;

a second multiplexer operably coupled to the in-phase register, the quadrature register, and the memory;

shift register operably coupled to the second multiplexer, wherein the shift register performs at least a portion of multiplication operations;

adder operably coupled to the shift register and the first multiplexer;

accumulator register operably coupled to an output of the adder, the in-phase register, the quadrature register, and the angular register; and controller that provides control signals to the in-phase register, the quadrature register, the angular register, the first multiplexer, the second multiplexer, the shift register, the adder, the accumulator register, and the memory, wherein, based on the control signals, the radius value and the phase value are determined from the in-phase signal and the quadrature signal by iteratively approximating the radius value and the phase value based upon the in-phase signal and the quadrature signal.

2. The circuit of claim 1 further comprising interoperable coupling of the in-phase register, the quadrature register, the angular register, the first multiplexer, the memory, the second multiplexer, the shift register, the adder, and the accumulator register to produce the radius value and the phase value based upon a CORDIC algorithm.

3. The circuit of claim 1 further comprising dynamic memory interoperably coupled to the in-phase register, the quadrature register, the angular register, and the accumulator register, wherein the dynamic memory stores radius values and phase values.

4. The circuit of claim 3 further comprising interoperable coupling of the dynamic memory, the quadrature register, the first multiplexer, the second multiplexer, and the adder to extract frequency modulated information from phase values based upon frequency modulation control signals provided by the controller.

5. The circuit of claim 3 further comprising interoperable coupling of the in-phase register, the dynamic memory, and the accumulator register to extract amplitude modulated information from radius values based upon amplitude modulation control signals provided by the controller.

6. The circuit of claim 3 further comprising interoperable coupling of the dynamic memory, the in-phase register, the quadrature register, the first multiplexer, the second multiplexer, the shift register, the adder, and the accumulator register to produce filtered signals from unfiltered signals based upon the control signals provided by the controller.

7. A multi-task arithmetic unit for performing various arithmetic operation, the multi-task arithmetic unit comprising:

an in-phase register;

a quadrature register;

an angular register;

a first multiplexer operably coupled to the in-phase register, the quadrature register, and the angular register;

a second multiplexer operably coupled to the in-phase register and the quadrature register;

first shift register operably coupled to the first multiplexer, wherein the first shift register performs at least part of multiplication operations;

second shift register operably coupled to the second multiplexer, wherein the second shift register performs at least part of multiplication operations;

first adder operably coupled to the first shift register and the second shift register;

accumulator register operably coupled to an output of the first adder, the in-phase register, the quadrature register, the angular register and the first multiplexer; and controller that provides control signals to the in-phase register, the quadrature register, the angular register, the first multiplexer, the second multiplexer, the first shift register, the second shift register, the first adder, and the accumulator register, wherein, based on the control signals, various arithmetic operations are performed.

8. The multi-task arithmetic unit of claim 7 further comprising:

memory for storing phase divider information operably coupled to the second multiplexer; and interoperable coupling of the in-phase register, the quadrature register, the angular register, the first multiplexer, the second multiplexer, the memory, the first adder, the second shift register, and the accumulator register to produce a radius value and a phase from an in-phase signal and a quadrature signal value based upon a CORDIC algorithm.

9. The multi-task arithmetic unit of claim 8 further comprising dynamic memory interoperably coupled to the in-phase register, the quadrature register, and the accumulator register, wherein the dynamic memory stores resultants of the various arithmetic operations.

10. The multi-task arithmetic unit of claim 9 further comprising interoperable coupling of the dynamic memory, the angular register, the first multiplexer, the second multiplexer, and the first adder to extract frequency modulated information from phase values based upon frequency modulation control signals provided by the controller.

11. The multi-task arithmetic unit of claim 9 further comprising interoperable coupling of the dynamic memory, the in-phase register, and the accumulator register to extract amplitude modulated information from radius values based upon amplitude modulation control signals provided by the controller.

12. The multi-task arithmetic unit of claim 9 further comprising interoperable coupling of the dynamic memory, the in-phase register, the quadrature register, the first multiplexer, the second multiplexer, the first shift register, the second shift register, the first adder, and the accumulator register to produce filtered signals from unfiltered signals based upon filter control signals provided by the controller.

13. A parallel processor for performing various arithmetic operation, the parallel processor comprising:

a plurality of multi-task arithmetic units, each of the plurality of multi-task arithmetic units includes:

an in-phase register;

a quadrature register;

an angular register;

a first multiplexer operably coupled to the in-phase register, the quadrature register, and the angular register;

a second multiplexer operably coupled to the in-phase register and the quadrature register;

first shift register operably coupled to the first multiplexer, wherein the first shift register performs at least part of multiplication operations;

second shift register operably coupled to the second multiplexer, wherein the second shift register performs at least part of multiplication operations;

first adder operably coupled to the first shift register and the second shift register;

accumulator register operably coupled to an output of the adder, the in-phase register, the quadrature register, the angular register and the first multiplexer;

data bus operably coupled to each multi-task arithmetic unit;

memory operably coupled to each multi-task arithmetic unit;

dynamic memory operably coupled to each multi-task arithmetic unit; and controller that provides control signals to each of the plurality of multi-task arithmetic units, wherein, based on the control signals, various arithmetic operations are performed by the parallel processor.

\* \* \* \* \*